(12) United States Patent
Chen et al.

(10) Patent No.: US 6,864,168 B2
(45) Date of Patent: Mar. 8, 2005

(54) BUMP AND FABRICATING PROCESS THEREOF

(75) Inventors: William Tze-You Chen, Endicott, NY (US); Ho-Ming Tong, Taipei (TW); Chun-Chi Lee, Kaohsiung (TW); Su Tao, Kaohsiung (TW); Chih-Huang Chang, Tainan Hsien (TW); Jeng-Da Wu, Kaohsiung Hsien (TW); Wen-Pin Huang, Tainan (TW); Po-Jen Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/604,792

(22) Filed: Aug. 18, 2003

(65) Prior Publication Data

US 2004/0113272 A1 Jun. 17, 2004

(30) Foreign Application Priority Data

Sep. 10, 2002 (TW) .................................. 91120545 A

(51) Int. Cl.[7] ............................................. H01L 21/447
(52) U.S. Cl. ...................... 438/614; 438/613; 438/617
(58) Field of Search ................................. 438/613–614, 438/617

(56) References Cited

U.S. PATENT DOCUMENTS

| | | | |
|---|---|---|---|
| 5,059,553 A | * 10/1991 | Berndlmaier et al. | 438/614 |
| 5,937,320 A | * 8/1999 | Andricacos et al. | 438/614 |
| 6,049,130 A | * 4/2000 | Hosomi et al. | 257/750 |
| 6,586,322 B1 | * 7/2003 | Chiu et al. | 438/612 |
| 6,593,220 B1 | * 7/2003 | Yu et al. | 438/612 |

* cited by examiner

Primary Examiner—Allan R. Wilson
(74) Attorney, Agent, or Firm—Jiang Chyun IP Office

(57) ABSTRACT

A bump structure on a contact pad and a fabricating process thereof. The bump comprises an under-ball-metallurgy layer, a bonding mass and a welding lump. The under-ball-metallurgy layer is formed over the contact pad and the bonding mass is formed over the under-ball-metallurgy layer by conducting a pressure bonding process. The bonding mass having a thickness between 4 to 10 μm is made from a material such as copper. The welding lump is formed over the bonding mass such that a sidewall of the bonding mass is also enclosed.

9 Claims, 4 Drawing Sheets

BUMP AND FABRICATING PROCESS THEREOF

CROSS REFERENCE TO RELATED APPLICATIONS

This application claims the priority benefit of Taiwan application serial No. 91120545, filed on Sep. 10, 2002.

BACKGROUND OF INVENTION

1. Field of Invention

The present invention relates to a bump and fabricating process thereof. More particularly, the present invention relates to a bump having an improved barrier layer mechanical strength and fabricating process thereof.

2. Description of Related Art

In this information-hungry society, electronic products are used almost everywhere to meet our demands for communication, business transactions, education, recreation and much more. The principle drivers behind all these electrical devices are specially designed integrated circuits. As electronic technologies continue to advance, increasingly complex, functionally powerful and highly personalized electronic products are produced. Rapid progress in design also has brought about the current trend of product miniaturization. Many types of high-density semiconductor packages are developed using flip-chip technique. Since a flip-chip package utilizes the bump on each contact pad of a chip to make direct electrical contact with a substrate, average circuit length is shorter than other types of packages connected through the wire bonding or the tape automated bonding (TAB) method. The shortened circuit length improves overall performance of a flip-chip package over other conventional packages. Furthermore, the backside of the chip in a flip-chip package may be exposed by design to increase heat dissipation. Because of these advantages, flip-chip techniques for fabricating packages are adopted by most semiconductor package producers.

FIG. 1 is a magnified cross-sectional view of a portion of a conventional flip-chip package structure. As shown in FIG. 1, the flip-chip structure 100 includes a silicon chip 100 and at least a bump structure 170 (only one is shown in FIG. 1). The bump structure 170 includes an under-bump-metallurgy (UBM) layer 142 and a bump 160. The chip 110 has an active surface 112. The active surface 112 of the chip 110 has a passivation layer 114 and at least one contact pad 116 thereon. The passivation layer 114 has at least one opening 118 that exposes the contact pad 116. The under-ball-metallurgy (UBM) layer 142 is formed on the contact pad 116 of the chip 110. The UBM layer 142 includes an adhesion layer 120, a barrier layer 130 and a wettable layer 140. The adhesion layer 120 sits directly on the contact pad 116, the barrier layer 130 is over the adhesion layer 120 and the wettable layer 140 is over the barrier layer 130. The adhesion layer 120 is made from a material such as titanium or aluminum, the barrier layer 130 is made from a material such as nickel-vanadium alloy and the wettable layer 140 is made from a material such as copper. The bump 160 sits on the wettable layer 140. The bump 160 is made from a material such as lead-tin alloy.

In general, the aforementioned flip-chip package structure 100 has a thin wettable layer 140 of between 0.3 to 0.8 μm. Moreover, the copper in the wettable layer 140 may react quickly with the tin inside the bump 160. At the end of the copper-tin reaction, the tin within the bump 160 may further react with the nickel inside the barrier layer 130. Since the inter-metallic layer formed by the relatively slow reaction (more than 30 seconds) between tin and nickel is lumpy and discontinuous, ultimate contact with the adhesion layer 120 will be poor. Hence, the bump 160 may easily peel off from the upper surface of the chip 110.

SUMMARY OF INVENTION

Accordingly, one object of the present invention is to provide a bump structure and a fabricating process thereof capable of increasing mechanical strength of a barrier layer within the bump structure and hence preventing the bump structure from peeling off the chip via the barrier layer.

Before starting out to describe this invention, the spatial preposition "over" or "above" needs to be clarified. When the preposition "over" or "above" is used, the relationship between the two objects concerned may or may not have direct contact with each other. For example, an object A is "over" or "above" an object B may mean either object A is above object B and directly touching object B or object A is in the space above object B but without touching object B.

To achieve these and other advantages and in accordance with the purpose of the invention, as embodied and broadly described herein, the invention provides a bump structure over a contact pad. The bump structure includes an under-bump-metallurgy (UBM) layer, a bonding mass and a bump. The under-ball-metallurgy layer sits over the contact pad. The bonding mass is formed over the under-ball-metallurgy layer by pressure bonding. The bonding mass is made from a material such as copper and has a thickness ranging between 4 to 10 μm. The bump is above the bonding mass and covers a sidewall of the bonding mass.

According to one preferred embodiment of this invention, the under-ball-metallurgy layer may further include an adhesion layer and a barrier layer. The adhesion layer sits over the contact pad and is made from a material such as titanium, titanium-tungsten alloy, aluminum or chromium. The barrier layer sits over the adhesion layer and is made from a material such as nickel-vanadium alloy or nickel. The bonding mass sits over the barrier layer. In addition, the bump may be made from a material such as lead-tin alloy. The bump may be made from a lead-free material such as a single metallic substance or an alloy of metallic substances selected from tin, gold, silver, copper, bismuth, antimony, indium or zinc.

This invention also provides a process for fabricating a bump structure. First, an under-ball-metallurgy layer is formed over a wafer. Thereafter, a pressure bonding process is conducted to form a bonding mass over the under-ball-metallurgy layer. A solder material is applied over the bonding mass. A reflow process is conducted to solidify the solder material and hence form a bump over the bonding mass.

In brief, since the bonding mass is a relatively thick layer ranging between 4 to 10 μm, reaction time between copper and tin is extended. Hence, the amount of platy and discontinuous inter-metallic material resulting from the reaction between nickel and tin is restricted. Ultimately, bonding strength between the bump and the chip is increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
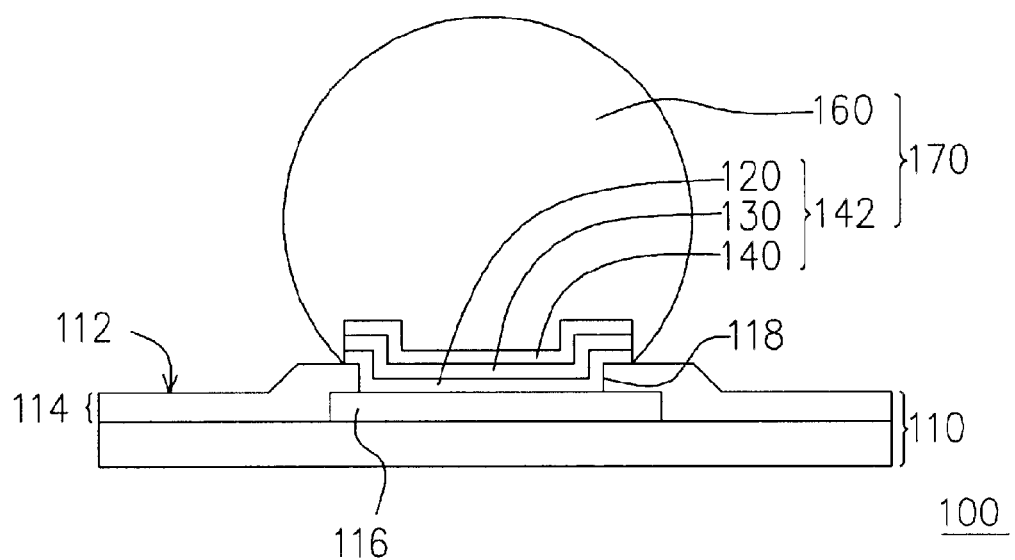
FIG. 1 is a magnified cross-sectional view of a portion of a conventional flip-chip package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
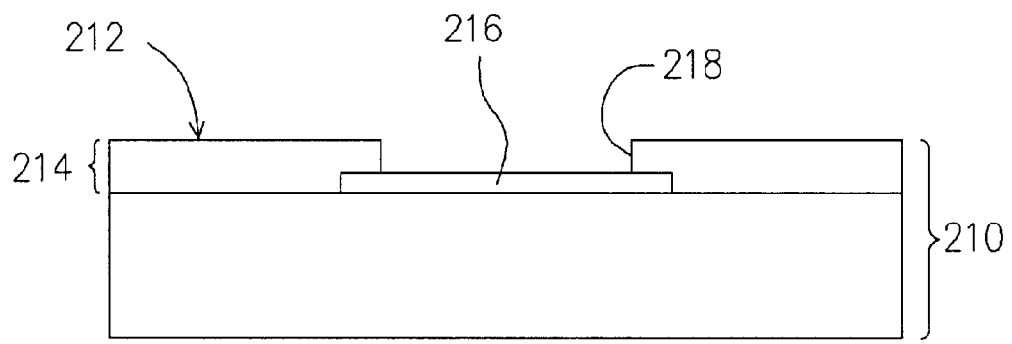
FIGS. 2 to 10 are magnified cross-sectional views showing the progression of steps for fabricating a bump structure according to one preferred embodiment of this invention.

FIGS. 2 to 10 are magnified cross-sectional views showing the progression of steps for fabricating a bump structure according to one preferred embodiment of this invention. First, as shown in FIG. 2, a silicon wafer 210 is provided. The wafer 210 has an active surface 212. The active surface 212 has a passivation layer 214 and a plurality of contact pads (only one is shown in FIG. 2) thereon. The passivation layer 214 has a plurality of openings 218 each exposing a contact pad 216. The passivation layer 214 may be an inorganic compound layer such as a silicon oxide layer or a phosphosilicate glass (PSG) layer. Alternatively, the passivation layer 214 may be a composite layer comprising a stack of the aforementioned inorganic compound layers. Furthermore, the passivation layer 214 may also be an organic compound layer such as a polyimide layer.

Figure 3:
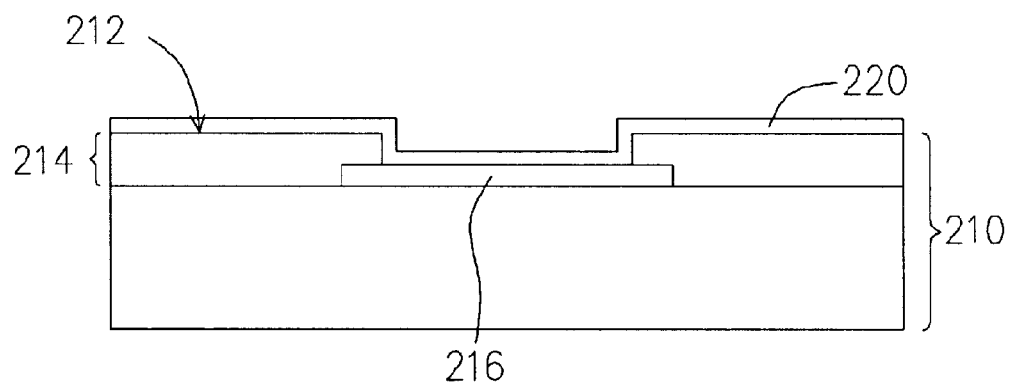
Figure 4:
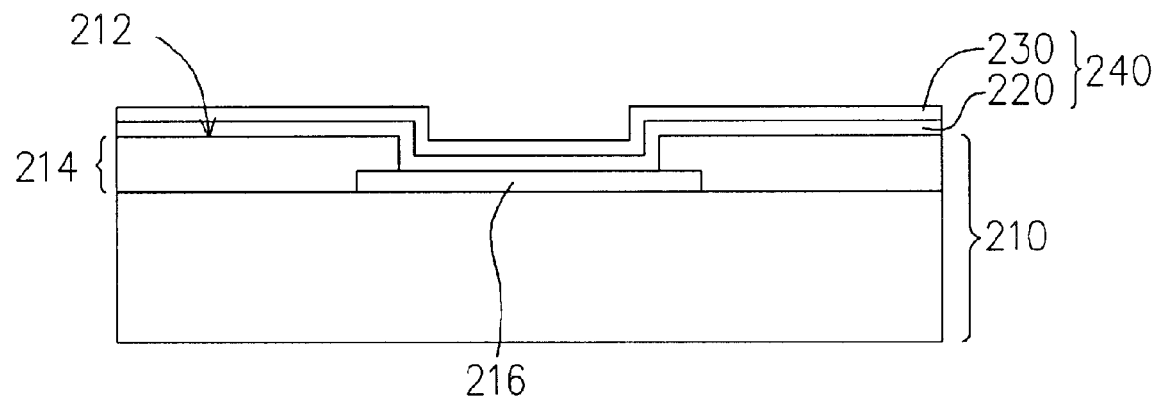

A sputtering process is next carried out to form an adhesion layer 220 over the active surface 212 of the wafer 210. The adhesion layer 220 covers the contact pad 216 and the passivation layer 214 to form a structure as shown in FIG. 3. The adhesion layer 220 is made from a material such as titanium, titanium-tungsten alloy, aluminum or chromium. Another sputtering or an electroplating process is conducted to form a barrier layer 230 over the adhesion layer 220, thereby forming a structure as shown in FIG. 4. The barrier layer 230 is made from a material such as nickel-vanadium alloy or nickel. The adhesion layer 220 and the barrier layer 230 together constitute an under-ball-metallurgy layer 240.

Figure 5:
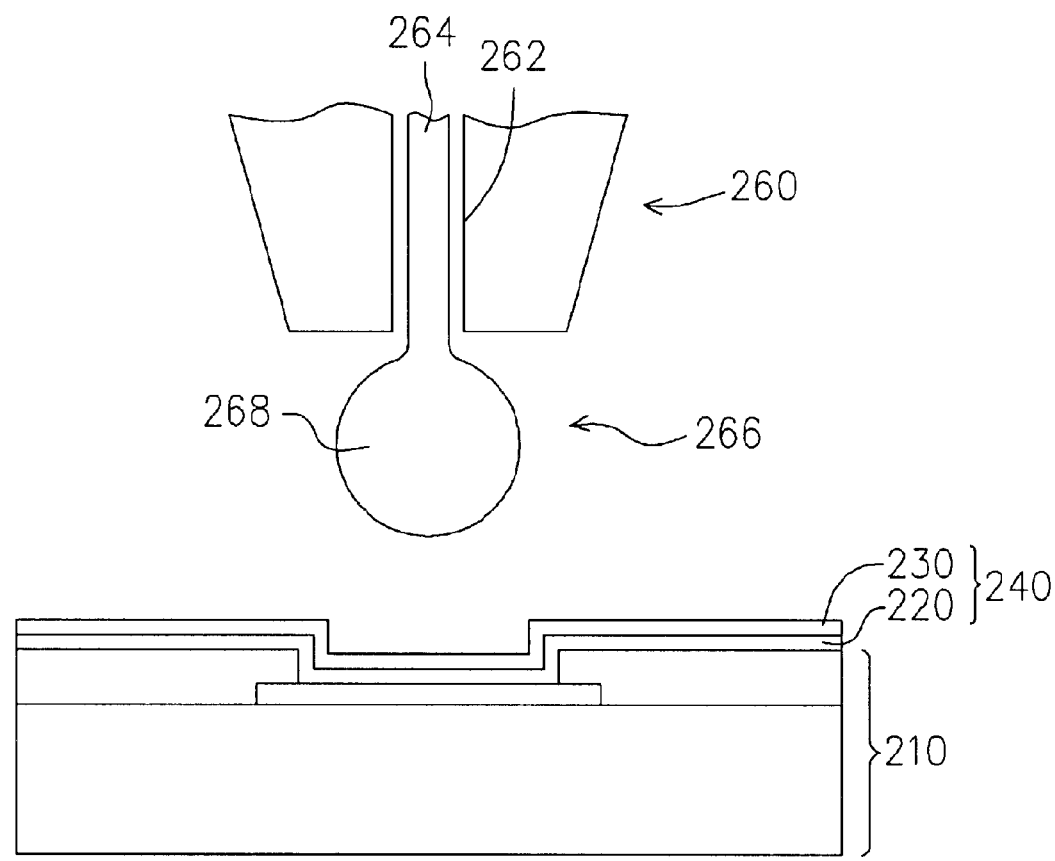

Thereafter, a plurality of bonding masses (only one is shown in FIG. 5) is formed over the barrier layer 230. As shown in FIG. 5, a conventional stud-bump-forming machine is utilized to attach a bonding mass onto the barrier layer 230. The stud-bump-forming machine has a bonding head 260 with a capillary 262 therein. The capillary 262 accommodates a bonding wire 264. The bonding wire 264 is free to slide inside the capillary 262. A point discharge method is used to generate heat at one end 266 of the conductive wire 264 so that the heated end melts. Due to intermolecular adhesion between the metallic atoms within the wire, the heated end of the wire 264 transforms into a spherical ball 268. Throughout the point discharge process, nitrogen and hydrogen are passed to prevent any oxidation on the surface of the spherical ball 268 due to high temperature.

Figure 6:
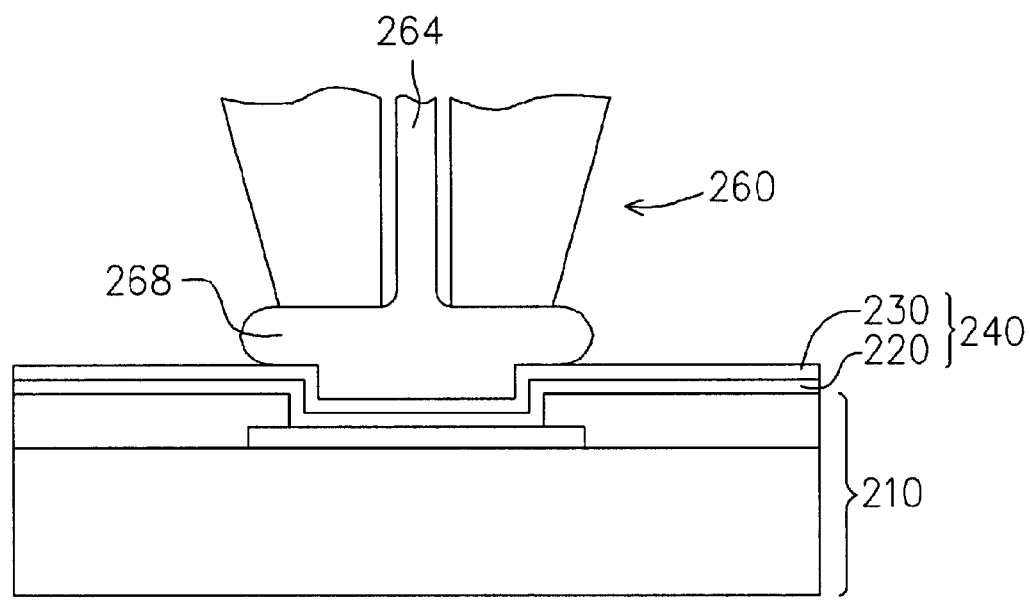
Figure 7:
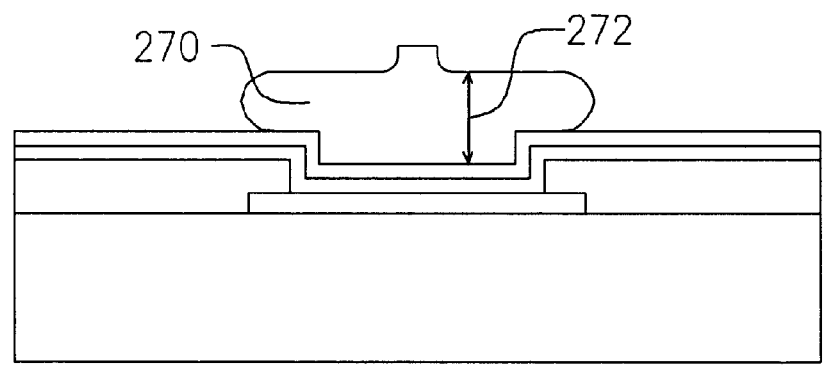

The spherical ball 268 is pulled down to press against the upper surface of the barrier layer 230 before the spherical ball 268 solidifies as shown in FIG. 6. Ultrasound may also be applied to facilitate the joining of the spherical ball 268 with the barrier layer 230. At this moment, the spherical ball 268 and the barrier layer 230 melt into each other so that the spherical ball 264 is eventually fastened firmly onto the upper surface of the barrier layer 230. The bonding head 260 is immediately raised so that the wire 264 detaches from the spherical ball 268 to form the structure as shown in FIG. 7. Hence, a bonding mass 270 is formed over the barrier layer 230. The bonding mass 270 is made from a material such as copper. Preferably, each bonding mass 270 has an overall thickness 272 between about 4 to 10 µm.

Figure 8:
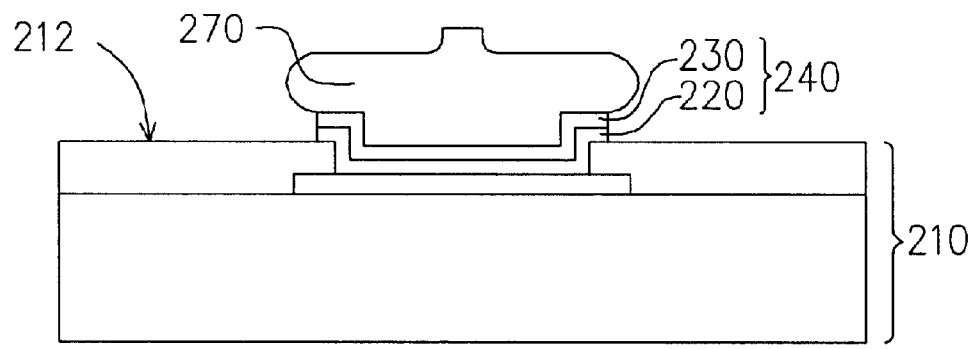

Using the bonding mass 270 as an etching mask, the under-ball-metallurgy layer 240 is removed by etching to expose the active surface 212 of the wafer 210. However, a residual under-ball-metallurgy layer 240 remains underneath the bonding mass 270. In other words, a portion of the adhesion layer 220 and the barrier layer 230 remains underneath the bonding mass 270 to form a structure as shown in FIG. 8.

Figure 9:
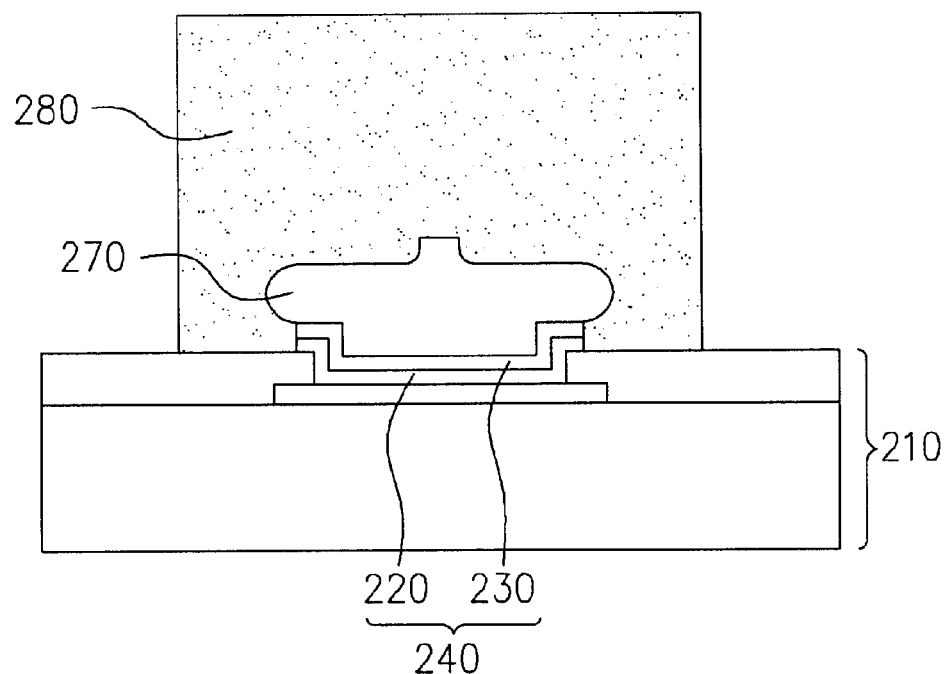
Figure 10:
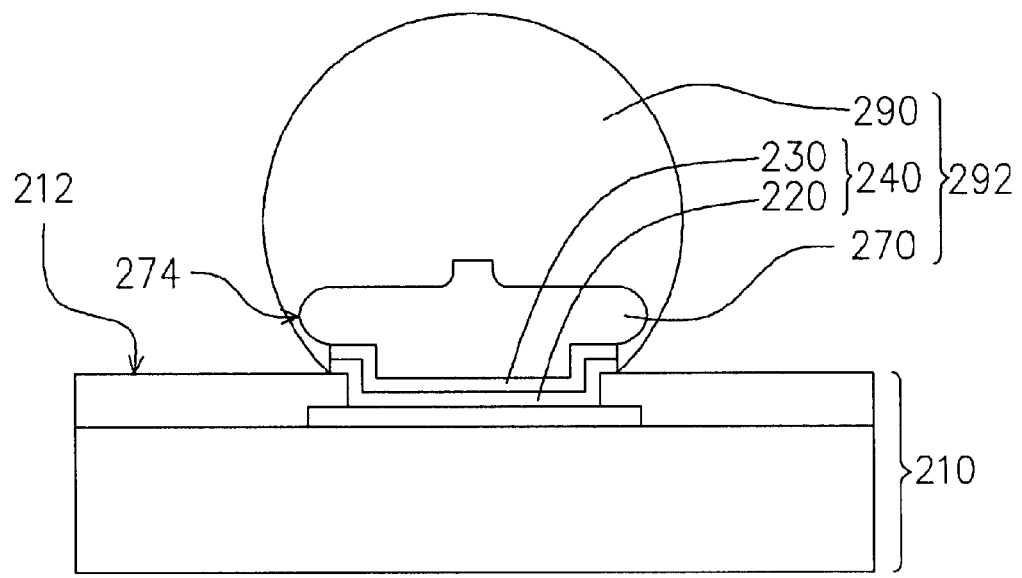

A screen-printing method is used to form solder blocks 280 (only one is shown) over the bonding mass 270 as shown in FIG. 9. The solder blocks contain material made by mixing together metallic particles and flux agents. Thereafter, a reflow process is carried out so that the metallic particles inside each pasty solder block 280 melt and coalesce together into a bump 290 (only one is shown) over the bonding mass 270. The flux agents serve to remove any oxide material from the surface of the bump 290 and the bonding mass 270 so that the bump 290 and the bonding mass 270 are tightly bonded together to form a structure as shown in FIG. 10. The bump 290 can be made from a material such as lead-tin alloy or a lead-free material such as tin, gold, tin-copper alloy, tin-technetium alloy, tin-bismuth alloy, tin-indium alloy, tin-zinc alloy, tin-silver alloy, tin-bismuth-silver alloy, tin-bismuth-technetium alloy, tin-bismuth-zinc alloy, tin-bismuth-indium alloy or tin-silver-copper alloy. Since a portion of the non-volatile flux agents may remain after the bump 290 is formed, a special solvent is applied to the wafer to remove any residual flux agents from the surface of the bump 290 and the active surface 212 of the wafer 210. The under-ball-metallurgy layer 240, the bonding mass 270 and the bump 290 together constitute a complete bump structure 292. In addition, the bump 290 encloses the sidewalls 274 of bonding mass 270 as well.

In the aforementioned bump structure 292, the bonding mass 270 is a relatively thick layer having a thickness ranging between 4 to 10 µm. With such thickness, reaction time between copper and tin is extended, thereby reducing the formation of a platy and discontinuous inter-metallic layer through prolonged reaction between nickel and tin. Ultimately, bonding strength between the bump 290 and the wafer 210 is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process of fabricating a bump structure, comprising the steps of:

forming an under-ball-metallurgy layer over a wafer;

pressure bonding a bonding mass onto the upper surface of the under-ball-metallurgy layer;

removing a portion of the under-ball-metallurgy layer so that only a residual under-ball-metallurgy layer remains underneath the bonding mass;

forming a solder material over the bonding mass; and conducting a reflow process to solidify the solder material into a bump above the bonding mass.

2. The process of claim 1, wherein the step of forming an under-ball-metallurgy layer over the wafer includes the sub-steps of:

forming an adhesion layer over the wafer; and forming a barrier layer over the adhesion layer.

3. The process of claim 2, wherein material constituting the adhesion layer is selected from the group consisting of titanium, titanium-tungsten alloy, aluminum and chromium.

4. The process of claim 2, wherein material constituting the barrier layer is selected from the group consisting of nickel-vanadium alloy and nickel.

5. The process of claim 1, wherein material constituting the bonding mass includes copper.

6. The process of claim 1, wherein the bonding mass has a thickness between about 4 to about 10 $\mu$m.

7. The process of claim 1, wherein material constituting the bump includes a lead-tin alloy.

8. The process of claim 1, wherein material constituting the bump includes a lead-free alloy.

9. The process of claim 8, wherein material constituting the bump is selected from the group consisting of tin, gold, silver, copper, bismuth, antimony, indium, zinc or combinations thereof in the form of an alloy.

* * * * *